(12) United States Patent
Montana et al.

(10) Patent No.: US 10,217,291 B2
(45) Date of Patent: Feb. 26, 2019

(54) DESIGNING A MODELED VOLUME REPRESENTED BY DEXELS

(71) Applicant: Dassault Systemes, Velizy Villacoublay (FR)

(72) Inventors: Nicolas Montana, Aix-en-Provence (FR); Marc Monteil, Rognac (FR); Romain Nosenzo, Aix-en-Provence (FR); Andre Lieutier, Puyricard (FR)

(73) Assignee: DASSAULT SYSTEMES, Velizy Villacoublay (FR)

(*) Notice: Subject to any disclaimer, the term of this patent is extended or adjusted under 35 U.S.C. 154(b) by 112 days.

(21) Appl. No.: 13/666,900

(22) Filed: Nov. 1, 2012

(65) Prior Publication Data

US 2013/0116984 A1    May 9, 2013

(30) Foreign Application Priority Data

Nov. 3, 2011  (EP) .................................. 11306424

(51) Int. Cl.
*G06F 17/50* (2006.01)
*G06T 19/20* (2011.01)
*G06T 17/00* (2006.01)

(52) U.S. Cl.
CPC .............. *G06T 19/20* (2013.01); *G06T 17/00* (2013.01); *G06F 17/50* (2013.01); *G06T 2219/2021* (2013.01)

(58) Field of Classification Search
None
See application file for complete search history.

(56) References Cited

U.S. PATENT DOCUMENTS

| | | | |
|---|---|---|---|
| 4,833,617 A | 5/1989 | Wang et al. |
| 5,710,709 A | 1/1998 | Oliver et al. |
| 6,311,100 B1 | 10/2001 | Sarma et al. |
| 7,747,418 B2 | 6/2010 | Lcu et al. |
| 7,832,968 B2 | 11/2010 | Glaesser |

(Continued)

FOREIGN PATENT DOCUMENTS

| | | |
|---|---|---|
| WO | WO 2010/082378 A1 | 7/2010 |
| WO | WO 2011/042764 A1 | 4/2011 |

OTHER PUBLICATIONS

Zhao, Hanli, et al. "Parallel and efficient Boolean on polygonal solids." The Visual Computer 27.6-8 (2011): 507-517.*

(Continued)

*Primary Examiner* — Omar F Fernandez Rivas
*Assistant Examiner* — Bijan Mapar
(74) *Attorney, Agent, or Firm* — Hamilton, Brook, Smith & Reynolds, P.C.

(57) ABSTRACT

It is provided a computer-implemented method for designing a modeled volume. The method comprises providing a set of dexels that represents the modeled volume, each dexel comprising a set of at least one segment representing the intersection between a line and the modeled volume, wherein the set of dexels is partitioned into groups of neighboring dexels, and wherein a memory space depending on the maximum number of segments comprised in each of the dexels of the group is allocated to each group; providing a sculpting operation on the modeled volume; and updating the set of dexels in response to the sculpting operation. Such a method improves the design of a modeled volume represented by a set of dexels.

18 Claims, 5 Drawing Sheets

(56) References Cited

U.S. PATENT DOCUMENTS

| | | |
|---|---|---|
| 8,538,574 B2 | 9/2013 | Hahn |
| 9,117,300 B2 | 8/2015 | Montana et al. |
| 9,524,583 B2 | 12/2016 | Montana et al. |
| 2001/0048857 A1 | 12/2001 | Koch et al. |
| 2002/0133264 A1 | 9/2002 | Maiteh et al. |
| 2003/0083773 A1 | 5/2003 | Schwanecke et al. |
| 2005/0113963 A1 | 5/2005 | Cho et al. |
| 2006/0094951 A1 | 5/2006 | Dean et al. |
| 2009/0148251 A1 | 6/2009 | Glasser et al. |
| 2010/0298967 A1 | 11/2010 | Frisken et al. |
| 2012/0089247 A1 | 4/2012 | Kawauchi et al. |
| 2012/0221300 A1* | 8/2012 | Tukora ............................. 703/1 |
| 2012/0330620 A1 | 12/2012 | Sullivan et al. |
| 2013/0030781 A1 | 1/2013 | Yoneda et al. |
| 2013/0116983 A1 | 5/2013 | Montana et al. |
| 2013/0116990 A1 | 5/2013 | Montana et al. |
| 2016/0188770 A1 | 6/2016 | Montana et al. |

OTHER PUBLICATIONS

Lagae, Ares, and Philip Dutré. "Time and space efficient grids for ray tracing." CW Reports (2007).*
Yuksek, Kemal, et al. "A new contour reconstruction approach from dexel data in virtual sculpting." Geometric Modeling and Imaging, 2008. GMAI 2008. 3rd International Conference on. IEEE, 2008.*
"ATI Stream Computing OpenCL™ Programming Guide," ATI Stream Computing Programming Guide, Advanced Micro Devices, Inc., *p. 4-37*, Jun. 1, 2010.
Hook, T.V., "Real-Time Shaded NC Milling Display," *Computer Graphics, ACM*, 20(4): 15-18 (Aug. 18, 1986).
Huang, Yunching et al., "NC Milling Error Assessment and Tool Path Correction," *Proceedings of the 21st Annual Conference on Computer Graphics and Interactive Techniques*, 1994.
Ilushin, O. et al., "Precise Global Collision Detection IN Multi-Axis NC-Machining," *Computer-Aided Design*, 37: 909-920 (2005).
Jimenez, P. et al., "3D Collision Detection: A Survey," *Computer & Graphics*, 25(2): 269-285 (Apr. 1, 2001).
König, A. H. et al., "Real Time Simulation and Visualization of NC Milling Processes for Inhomogeneous Materials on Low-End Graphics Hardware," IEEE Proceedings, Hannover, Germany, pp. 338-349 (Jun. 22-26, 1998).
Liu, S.Q. et al., "Real-Time, Dynamic Level-of-Detail Management for Three-Axis NC Milling Simulation," *Computer-Aided Design*, 38(4): 378-391 (Apr. 2006).
Mayr, H. el al., "A Solid Modeler for Dynamic Objects Using the Dexel Representation," *Proceeding of ICED '91, International Conference on Engineering Design*, Zurich, Switzerland, pp. 1082-1085 (Aug. 27, 1991).
Muller, H. et al., "Online Sculpting and Visualization of Multi-Dexel Volumes," *SM '03 Proceedings of the 8th ACM Symposium on Solid Modeling and Applications*, (2003).
Peng, X. et al., "A Virtual Sculpting System Based on Triple Dexel Models with Haptics," *Computer-Aided Design and Applications*, 6(5): 645-659 (Jan. 1, 2009).
Ren, Y. et al., "Virtual Prototyping and Manufacturing Planning by Using Tri-Dexel Models and Haptic Force Feedback," *Virtual and Physical Prototyping*, 1(1): 3-18 (Mar. 2006).
Stifter, S., "Simulation of NC Machining Based on the Dexel Model: A Critical Analysis," *Int. J. Adv. Manuf. Technol.*, 10: 149-157 (1995).
Tang, T.D. et al., "The Sweep Plane Algorithm for Global Collision Detection with Workpiece Geometry Update for Five-Axis NC Machining," *Computer Aided Design*, 39: 1012-1024 (2007).
Tukora, B. et al., "Fully GPU-based Volume Representation and Material Removal Simulation of Free-Form Objects," *Innovative Developments in Design and Manufacturing Advanced Research in Virtual and Rapid Prototyping—Proceedings of VR*, pp. 609-614 (Jan. 1, 2009).
Tukora, B. et al., "GPGPU-Based Material Removal Simulation and Cutting Force Estimation," *Proceedings of the Seventh International Conference on Engineering Computational Technology*, (1994).
Tukora, B. et al., "Multi-Dexel based Material Removal Simulation and Cutting Force Prediction with the Use of General-Purpose Graphics Processing Units," *Advances in Engineering Software*, 43(1): 65-70 (Aug. 16, 2011).
Wang, C.L. et al., "Layered Depth-Normal Images: A Sparse Implicit Representation of Solid Models," *Proceedings of ASME International Design Engineering Technical Conferences*, Brooklyn, NY.
European Search Report for European Application No. EP 11 30 6422; Date of Completion of Search: May 11, 2012.
European Search Report for European Application No. EP 11 30 6423; Date of Completion of Search: Jun. 19, 2012.
European Search Report for European Application No. EP 11 30 6424; Date of Completion of Search: May 24, 2012.
Albert, M., An Overview of 3+2 Machining, Oct. 4, 2006 http://www.mmsonline.com/articles/an-overview-of-3-2-machining.
Hopkins, B., Benefits of Positional Five-Axis Machining, May 1, 2007 http://www.moldmakingtechnology.com/articles/benefits-ofpositional-five-axis-machining.
MoldMaking, Five-Axis CAD/CAM Integration Helps Optimize Moldmaker's Machine Utilization, Apr. 1, 2011, http://www.moldmakingtechnology.com/articles/five-axis-cadcam-integration-helps-optimize-moldmakers-machine-utilization.
Kadir, A.A., et al., "Virtual Machine Tools and Virtual Machining—A Technical Review," *Robotics and Computer-Integrated Manufacturing*, 27: 494-508 (2010).
Peng, X., 3 Interactive Solild Modelling in a Virtual Environment with Haptic Interface, Virtual and Augmented Reality Applications in Manufacturing, Springer-Verlag London 2004.
Wang, W.P., Geormetric Modeling for Swept Volume of Moving Solids, IEEE, 1986 Van Hook, T., Real-Time Shaded NC Milling Display, SIGGRAPH 1986, vol. 20, No. 4, 1986.
Van Hook., T., "Real-Time Shaded NC Milling Display," SIGGRAPH, 20(4)15-18 (1986).
Zalewski, M., Guerrilla Guide to CNC Machining, vol. 1: Basic Theory and Preparations, http://diyhpl.us/-bryan/papers2/guerrilla_cnc1.html.
König et al., "Real Time Simulation and Visualization of NC Milling Processes for Inhomogeneous Materials on Low-End Graphics Hardware", http://user.engineering.uiowa.edu/-amalek/sweep/, 1999, 15 pages.
Wright (Tool Path Generation for Finish Machining of Freeform Surfaces in the Cybercut Process Planning Pipeline, LMAS UC Berkeley, 2007).
OpenGL GUI, Archived Wiki definition dated Jul. 27, 2010 http://web.archive.org/web/20100727160446/http://gigi.sourceforge.net/.
Lee (Complete swept volume generation, Part 1: Swept volume of a piecewise C1-continuous cutter at five-axis milling via Gauss map).
Bouma, W. and Vanecek, G., "Collision detection and analysis in a physically based simulation", Proceedings Eurographics workshop on animation.
CAMWorks, http://www.camworks.com/modules/multiaxismachining/.
Dautry, R. and Lions, J-L, "Mathematical Analysis and Numerical Methods for Science and Technology, vol. $, Intergral Equations and Numerical Methods," Springer, eds., pp. 173-240.
Gottschalk, S., et al., "OBBTree: A Hierarchical Structure for Rapid Interference Detection," Dept. of Computer Science, University of North Carolina http://www.cs.unc.edu/~geom/OBB/OBBT.html.
Hoffmann, C. M., "Geometric and Solid Modeling", San Mateo, California (1989).
http:/www.cs.tau.ac.il/~haimk/seminar09b/Lower Envelopes.pptx.
Lin, M. and Gottschalk, S., "Collision detection between geometric models: A survey", Proc. of IMA Conference on Mathematics of Surfaces, 20 pages (1998).
Peternell, M. et al., "Swept Volumes", *Computer Aided Design & Applications*, 2(5): 599-608 (2005).
Qin, Zhang, et al., "Improvement of collision-detection algorithm based on OBB," J. Huazhong Univ. of Sci. & Tech. (Nature Science Edition) 31:1 (Jan. 2003).

(56) References Cited

OTHER PUBLICATIONS

Shewchuk, J. R., "Adaptive Precision Floating-Point Arithmetic and Fast Robust Predicates" Discrete & Computational Geometry, 18(3): 305-363 (Oct. 1997).

Su, C.-J. et al., "A new collision detection method for CSG-represented objects in virtual manufacturing," Computers in Industry, 40(1): 1-13 (Sep. 1999).

Van Den Bergen, G., "Efficient Collision Detection of Complex Deformable Models using AABB Trees," Dept. of Mathematics and Computing Science, Eindhoven University of Technology (Nov. 6, 1998).

* cited by examiner

DESIGNING A MODELED VOLUME REPRESENTED BY DEXELS

RELATED APPLICATION

This application claims priority under 35 U.S.C. § 119 or 365 to European Application No. 11306424.0, filed Nov. 3, 2011.

The entire teachings of the above application(s) are incorporated herein by reference.

FIELD OF THE INVENTION

The invention relates to the field of computer programs and systems, and more specifically to a method, system and program for designing a modeled volume represented by a set of dexels.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such systems, the graphical user interface (GUI) plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise.

The PLM solutions provided by Dassault Systemes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Some of these systems allow the representation of a modeled volume with a set of dexels. Several papers or patent documents notably suggest using dexel representation for machining simulation or interactive sculpting.

Examples of such documents are:
the paper entitled "A Virtual Sculpting System Based on Triple Dexel Models with Haptics", Xiaobo Peng and Weihan Zhang, Computer-Aided Design and Applications, 2009;
the paper entitled "NC Milling Error Assessment and Tool Path Correction", Yunching Huang and James H. Oliver, Proceedings of the 21st annual conference on Computer graphics and interactive techniques, 1994;
"Online Sculpting and Visualization of Multi-Dexel Volumes", Heinrich Muller, Tobias Surmann, Marc Stautner, Frank Albersmann, Klaus Weinert, SM '03 Proceedings of the eighth ACM symposium on Solid modeling and applications;
the paper entitled "Virtual prototyping and manufacturing planning by using tri-dexel models and haptic force feedback", Yongfu Ren, Susana K. Lai-Yuen and Yuan-Shin Lee, Virtual and Physical Prototyping, 2006;
the paper entitled "Simulation of NC machining based on the dexel model: A critical analysis", Sabine Stifter, The International Journal of Advanced Manufacturing Technology, 1995;
the paper entitled "Real time simulation and visualization of NC milling processes for inhomogeneous materials on low-end graphics hardware", Konig, A. H. and Groller, E., Computer Graphics International, 1998. Proceedings;
U.S. Pat. No. 5,710,709;
U.S. Pat. No. 7,747,418.

GPGPU (General-Purpose computing on Graphics Processing Units) is the technique of using a graphic processing unit (GPU) which typically handles computation only for computer graphics, to perform computation in applications traditionally handled by the central processing unit (CPU). Some papers consider using the computation power of modern graphics processing units (GPU) for dexel representation. These papers make use of the LDNI (Layered Depth-Normal Images) algorithm, which is associated to a specific memory model.

Examples of such papers are:
the paper entitled "GPGPU-based Material Removal Simulation and Cutting Force Estimation", B. Tukora and T. Szalay, CCP: 94: Proceedings Of The Seventh International Conference On Engineering Computational Technology;
the paper entitled "Layered Depth-Normal Images: a Sparse Implicit Representation of Solid Models", Charlie C. L. Wang and Yong Chen, Proceedings of ASME international design engineering technical conferences. Brooklyn (NY).

However, the solutions listed above lack efficiency, notably from a memory performance point of view and from a user utilization point of view. Within this context, there is still a need for an improved solution for designing a modeled volume represented by a set of dexels.

SUMMARY OF THE INVENTION

According to one aspect, it is therefore provided a computer-implemented method for designing a modeled volume. The method comprises providing a set of dexels that represents the modeled volume. Each dexel comprises a set of at least one segment representing the intersection between a line and the modeled volume. The set of dexels is partitioned into groups of neighboring dexels. And a memory space depending on the maximum number of segments comprised in each of the dexels of the group is allocated to each group. The method also comprises providing a sculpting operation on the modeled volume and updating the set of dexels in response to the sculpting operation.

The method may comprise one or more of the following:
updating the set of dexels comprises determining groups of neighboring dexels that are impacted by the sculpting operation and updating each of the determined groups;
updating each of the determined groups comprises, for a respective group, updating the dexels of the respective group by parallel processing;
updating the dexels of the respective group, comprises, for a respective dexel of the respective group, evaluating the impact of the sculpting operation on the respective dexel, and, accordingly, modifying the respective dexel;

evaluating the impact of the sculpting operation on the respective dexel comprises evaluating the impact of the sculpting operation on the segments of the respective dexel;

updating the dexels of the respective group is performed by SIMD (Single Instruction Multiple Data) parallel processing;

the method further comprises adapting the memory space allocated to an updated group when the maximum number of segments comprised in each of the dexels of the updated group is modified;

the set of dexels is partitioned into the groups of neighboring dexels in adaptation to a hardware implied in the execution of the method and/or a sculpting context;

It is further proposed a system for designing a modeled volume, wherein the system comprises a memory having recorded thereon instructions for performing the above method and at least one processor coupled with the memory for executing the instructions.

The processor may be a massive parallel processing unit. The system may comprise at least one GUI suitable for launching execution of the instructions. The GUI may comprise a GPU and the processor may be the GPU.

It is further proposed a computer program comprising instructions for performing the above method.

It is further proposed a computer readable storage medium having recorded thereon the above computer program.

BRIEF DESCRIPTION OF THE DRAWINGS

Embodiments of the invention will now be described, by way of non-limiting example, and in reference to the accompanying drawings, where.

DETAILED DESCRIPTION OF THE INVENTION

Figure 1:
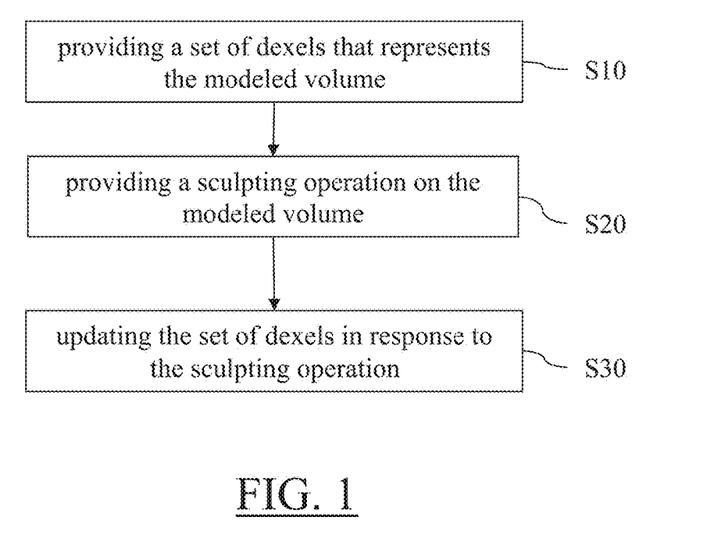
FIG. 1 shows a flowchart of an example of the method.

FIG. 1 shows a flowchart of an example of a computer-implemented method (hereafter referred to as "the method") for designing a modeled volume. The method comprises providing a set of dexels (S10). The set of dexels represents the modeled volume. Each dexel (of the set of dexels) comprises a set of at least one segment. Such segments represent the intersection between a line and the modeled volume. The set of dexels is partitioned into groups of neighboring dexels. A memory space depending on the maximum number of segments comprised in each of the dexels of the group is allocated to each group. The method also comprises providing a sculpting operation (S20) on the modeled volume. The method further comprises updating (S30) the set of dexels in response to the sculpting operation. Such a method improves the design of a modeled volume represented by a set of dexels.

It is also provided a modeled volume represented by a set of dexels, wherein each dexel (of the set of dexels) comprises a set of at least one segment. Such segments represent the intersection between a line and the modeled volume. The set of dexels is partitioned into groups of neighboring dexels. A memory space depending on the maximum number of segments comprised in each of the dexels of the group is allocated to each group. Features and examples of the method which are described hereunder also apply to such a modeled volume.

It is also provided an encoding scheme for representing a modeled volume by a set of dexels. The encoding scheme comprises providing a definition of a volume. The encoding scheme then defines a set of lines and computes the intersections of the set of lines with the volume, and determines corresponding dexels. The encoding scheme further partitions the set of dexels into groups of neighboring dexels, and allocates to each group a memory space depending on the maximum number of segments comprised in each of the dexels of the group. The step of providing a set of dexels (S10) may implement the encoding scheme. Features and examples of the method which are described hereunder also apply to such an encoding scheme.

The method may be comprised in a process of designing a CAD modeled object. "Designing a CAD modeled object" designates any action or series of actions which is at least part of a process of elaborating a modeled object. Thus, the method may comprise creating the CAD modeled object from scratch. Alternatively, the method may comprise providing a CAD modeled object previously created, and then modifying the CAD modeled object. In any case, the modeled volume designed by the method may represent the CAD modeled object or at least part of it, e.g. a 3D space occupied by the CAD modeled object. Because the method improves the design of a modeled volume represented by a set of dexels, the method also improves the design of a CAD modeled object.

A modeled object is any object defined by data stored in a memory of a computer system. By extension, the expression "modeled object" designates the data itself. A CAD modeled object is any object defined by data stored in a memory of a CAD system. According to the type of the system, the modeled objects may be defined by different kinds of data. A CAD system is any system suitable at least for designing a modeled object on the basis of a graphical representation of the modeled object, such as CATIA. Thus, the data defining a CAD modeled object comprise data allowing the representation of the modeled object (e.g. geometric data, for example including relative positions in space).

The method may be included in a manufacturing process, which may comprise, after performing the method, producing a physical product corresponding to the modeled volume. In any case, the modeled volume designed by the method may represent a manufacturing object. The modeled volume may thus be a modeled solid (i.e. a modeled object that represents a solid). The manufacturing object may be a product, such as a part, or an assembly of parts. Because the method improves the design of the modeled volume, the method also improves the manufacturing of a product and thus increases productivity of the manufacturing process. The method can be implemented using a CAM system, such as DELMIA. A CAM system is any system suitable at least for defining, simulating and controlling manufacturing processes and operations.

The method is computer-implemented. This means that the method is executed on at least one computer, or any system alike. Unless mentioned otherwise, all steps of the method are performed by the computer, i.e. without intervention of the user. For example, the step of updating (S30) may be performed by the sole computer, whereas the step of providing the set of dexels (S10) and the step of providing the sculpting operation (S20) may be performed by the sole computer or through user-interaction. Indeed, the step of providing the set of dexels (S10) may be launched by the user. The method thereby allows the automatic updating (S30) of the set of dexels that represents the modeled volume, in function of the sculpting operation provided possibly by the user. It is also worth mentioning that steps of the method may allow intervention of the user. For example, the user may intervene e.g. to modify the result of the algorithm run by the computer, for example modify the set of dexels that has been updated (S30). This amounts to a step of modifying the set of dexels as updated, the step of modifying being executed after the step of updating (S30).

A typical example of computer-implementation of the method is to perform the method with a system suitable for this purpose. The system may comprise a memory having recorded thereon instructions for performing the method. In other words, software is already ready on the memory for immediate use. The system is thus suitable for performing the method without installing any other software. Such a system may also comprise at least one processor coupled with the memory for executing the instructions. In other words, the system comprises instructions coded on a memory coupled to the processor, the instructions providing means for performing the method. Such a system is an efficient tool for designing a modeled volume.

Such a system may be a CAD system. The system may also be a CAE and/or CAM system, and the CAD modeled object may also be a CAE modeled object and/or a CAM modeled object. Indeed, CAD, CAE and CAM systems are not exclusive one of the other, as a modeled object may be defined by data corresponding to any combination of these systems.

The system may comprise at least one GUI for launching execution of the instructions, for example by the user. Notably, the GUI may allow the user to launch the step of providing a set of dexels (S10), whether by designing such a set of dexels (S10) from scratch or by retrieving it from a memory of the system, or exterior to the system but coupled to the system, e.g. by a network service. The GUI may also allow the user to provide the sculpting operation (S20). The GUI may comprise a GPU. In such a case, the processor may be the GPU. In other words, the processor executing at least steps of the method, in particular the step of updating (S30), may be the GPU. Such a system is an efficient tool for designing a modeled volume by a user. Since dexels based algorithms are well suited for massively parallel hardware, it is natural to consider using the computation power of modern graphic processing unit (GPU).

The modeled volume may be 3D (i.e. three-dimensional). This means that the modeled volume is defined by data allowing its 3D representation. A 3D representation allows the viewing of the represented volume from all angles. For example, the modeled volume, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

Figure 2:
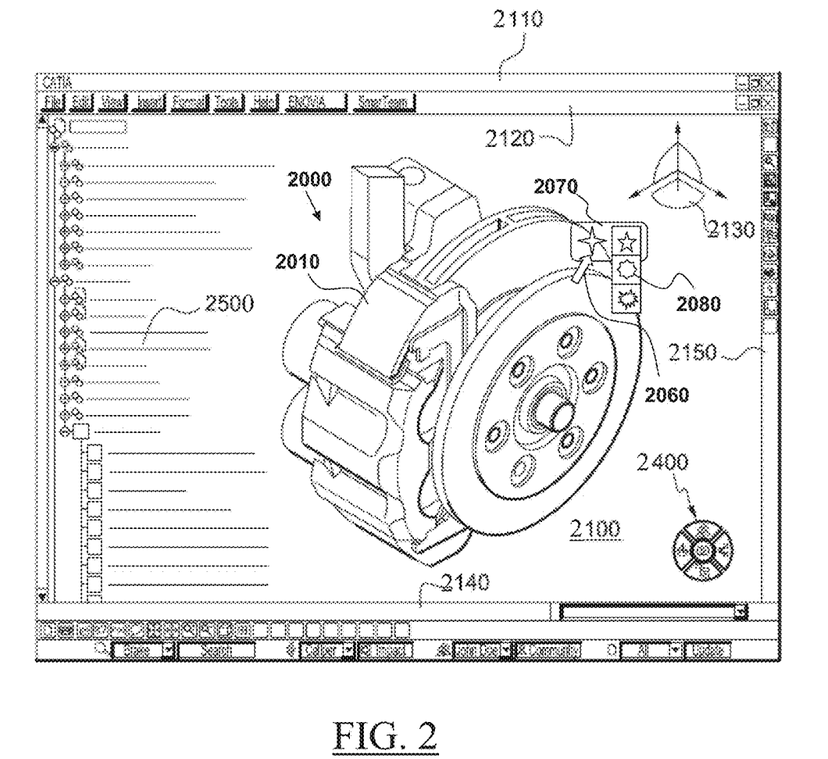
FIG. 2 shows an example of a graphical user interface.

FIG. 2 shows an example of the GUI of a typical CAD system.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. a sculpting operation, or any other operation such change the dimension, color, etc.) or edit geometrical constraints by selecting an appropriate icon. For example, typical CAD operations are the modeling of the punching or the folding of the 3D modeled object displayed on the screen.

The GUI may for example display data 2500 related to the displayed product 2000. In the example of FIG. 2, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 3:
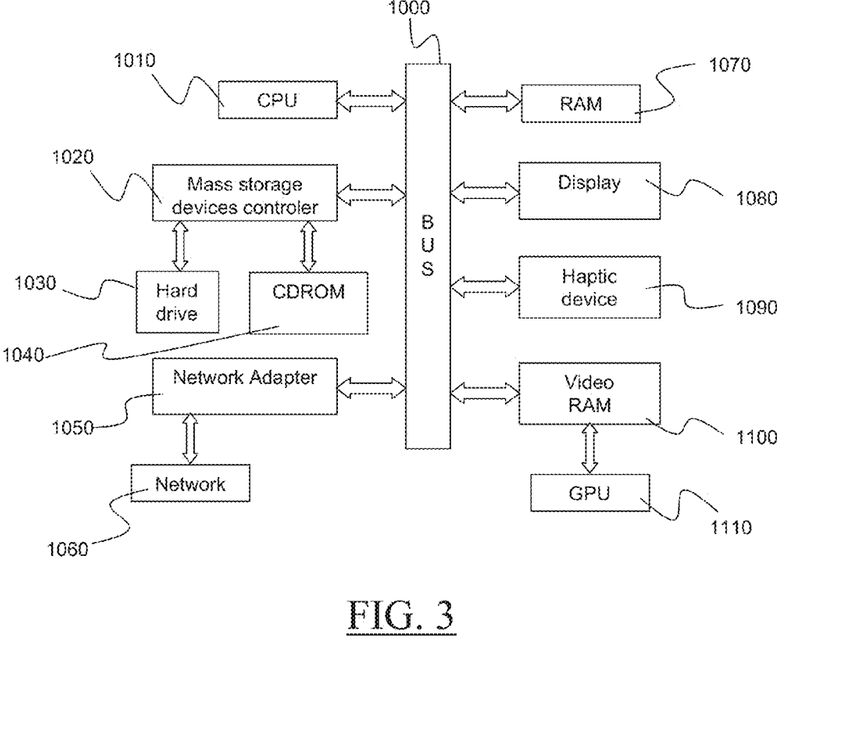
FIG. 3 shows an example of a client computer system.

FIG. 3 shows an example of the architecture of the system as a client computer system, e.g. a workstation of a user.

The client computer comprises a central processing unit (CPU) 1010 connected to an internal communication BUS 1000, a random access memory (RAM) 1070 also connected to the BUS. The client computer is further provided with a graphics processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on screen 1080, as mentioned with reference to FIG. 2. By screen, it is meant any support on which displaying may be performed, such as a computer monitor. In addition, the cursor control device allows the user to select various commands, and input control signals. The cursor control device includes a number of signal generation devices for input control signals to system. Typically, a cursor control device may be a mouse, the button of the mouse being used to generate the signals.

To cause the system to perform the method, it is provided a computer program comprising instructions for execution by a computer, the instructions comprising means for this purpose. The program may for example be implemented in digital electronic circuitry, or in computer hardware, firmware, software, or in combinations of them. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output. The instructions may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language, or in assembly or machine language if desired; and in any case, the language may be a compiled or interpreted language. The program may be a full installation program, or an update program. In the latter case, the program updates an existing CAD system to a state wherein the system is suitable for performing the method.

The method comprises providing a set of dexels (S10) that represents the modeled volume. This allows a light representation of the modeled volume (in other words, the modeled volume may be represented using little memory space). This also allows a representation of the modeled volume which may be easily handled. Notably, design operations on the modeled volume may be performed particularly efficiently when the modeled volume is represented by a set of dexels, due to the data structure of a set of dexels. Indeed, design operations may be performed with high responsiveness and high robustness.

The term "dexel" is known to be a shortcut for "depth element" (just as the term "pixel" is a shortcut for "picture element"). The notion of dexel has been mentioned in a large number of research papers. In the context of the method, a dexel comprises a set of at least one segment, i.e. a pair of 3D points. In an example, the modeled volume comprises at least one dexel which comprises a set of at least two segments. The segments of a dexel, if several, may be ordered (in such a case the dexel is a list), or unordered. The segments of a dexel represent the intersection between a line and the modeled volume. In other words, considering virtual lines intersecting with the modeled volume, a dexel is the set of the segments originating from a given line and that results from the computation of the intersection. Providing the set of dexels (S10) may thus comprise computing such intersections, e.g. by tracing virtual lines and computing their intersections with the modeled volume, which may be initially represented by a B-Rep or any other volume representation. The set of dexels thus represents the modeled volume.

It is important to note that the set of dexels is provided (S10) as computer-implemented data. Thus, the definitions provided above and below regarding any representation of the modeled volume have implications from a data structure point of view. For example, a segment may be provided as a pair of 3D positions (e.g. two 3D positions linked to each other). A 3D position may itself be provided as a list of three coordinates (e.g. floating points), associated to a referential 3D frame. A dexel is a set of segments, which implies that segments are linked together in a set structure. The dexels of a set of dexels may as well be linked together. Representing the modeled volume by a set of dexels, which themselves comprise a set of at least one segment, allows a fast updating (S30) of the modeled volume.

Figure 4:
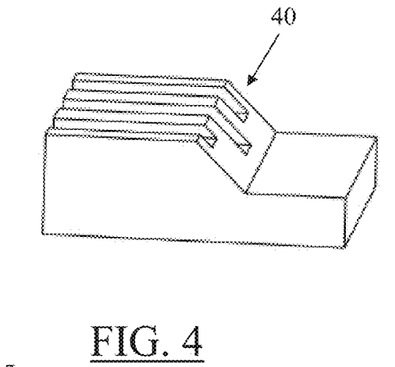
FIGS. 4-8 and 14 show examples of the method.
Figure 5:
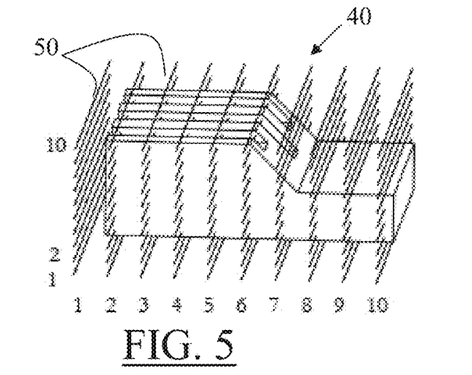

The concept of dexels is now illustrated with reference to FIGS. 4-6 which present an example of the step of providing the set of dexels (S10) as a dexel structure 67.

Given a modeled volume and given an infinite line, a dexel is the set of segments (or intervals) representing the intersection between the infinite line and the modeled volume. This set of segments is captured, in the memory, as a set of boundary points of each segment. A dexel structure is a set of dexels (each comprising a set of segments) which are organized, for example by being ordered on a rectangular grid. FIGS. 4 and 5 illustrate a modeled volume 40 together with a ten by ten grid of lines 50. The method of the example comprises providing modeled volume 40, e.g. as a B-Rep, as illustrated on FIG. 4. The method of the example then comprises defining a ten by ten grid of lines 50 that intersect (at least partly) modeled volume 40, as illustrated on FIG. 5. The method of the example then comprises computing dexels 65 which comprise sets of segments 60 and/or 62, as represented on FIG. 6. One dexel 65 is circled on the figure. A dexel 65 may comprise several segments 60, or one segment 62, depending on whether the line 50 intersects modeled volume 40 at one spot or at several separate spots. Of course, the method may alternatively retrieve dexels 65 from a memory. In any case, dexel structure 67 is thus provided.

Figure 6:
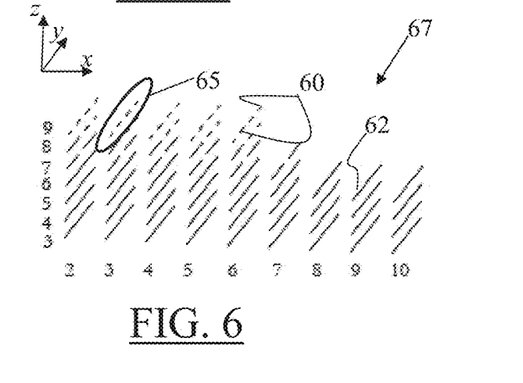

FIG. 6 illustrates the resulting dexel structure 67. It should be noticed that not all the lines 50 intersect modeled volume 40 (only fifty-two lines intersect modeled volume 40 in the example), yielding as many dexels 65 (lines not intersecting modeled volume 40 may indeed be discarded and yield no dexel). Furthermore, some lines 50 intersect modeled volume 40 through one segment 62 (dexel (2,3) or dexel (9,6) for example), others through several segments 60, for example two segments (dexel (7,7) or dexel (4,7) for example), or three segments (dexel (2,8) or dexel (5,8)), or four segments (dexel (2,9) or dexel (4,9)). The resulting dexel structure 67 includes fifty-two dexels 65 including thirty-six dexels 65 with one segment 62, six dexels 65 with two segments 60, five dexels 65 with three segments 60 and five dexels with fours segments 60.

The set of dexels provided at (S10) may be a tridexel structure. A tridexel structure is defined by comprising three dexel structures, typically a dexel structure parallel to the x-axis, a dexel structure parallel to the y-axis and a dexel structure parallel to z-axis. The method may comprise displaying a graphical representation of the modeled volume at any time, for example during the providing (S20) and the updating (S30). The displaying may be based on the set of dexels. A tridexel structure provides a good display because it is little "view direction" dependant. A tridexel structure notably provides a more accurate display when the user changes the viewpoint.

Figure 7:
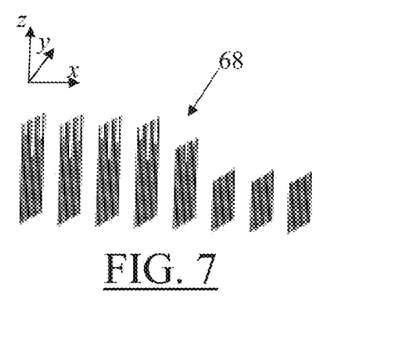
Figure 8:
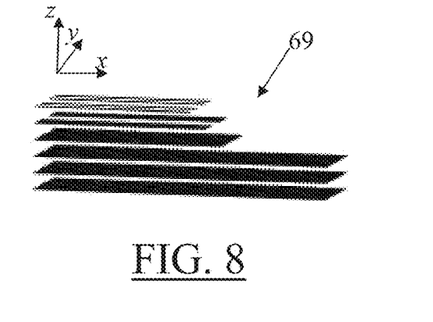
Figure 9:
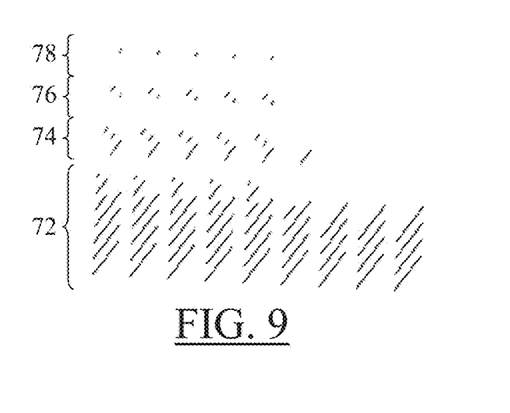
FIGS. 9-13 illustrate the prior art.
Figure 10:
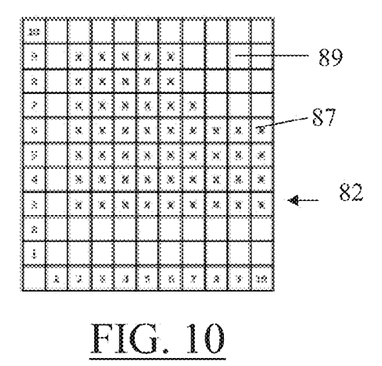
Figure 11:
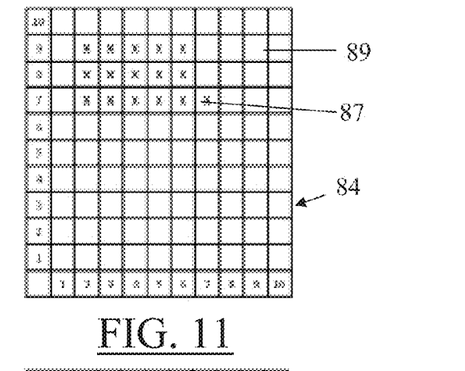
Figure 12:
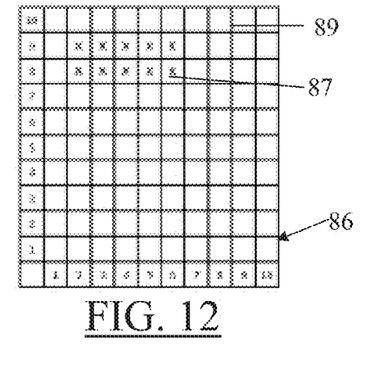
Figure 13:
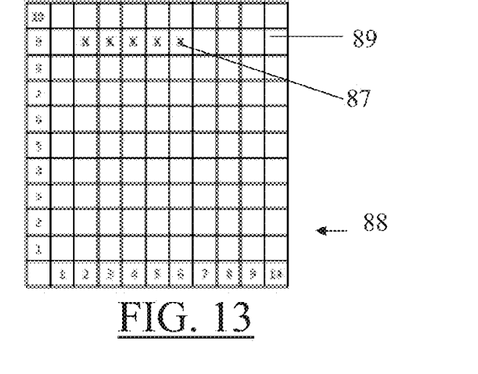

FIGS. 6-8 each represent a dexel structure representing a same modeled volume. In other words, the modeled volume may be defined by tridexel data, comprising the three dexel structures of FIGS. 6-8. FIG. 6 shows dexel structure 67, along the y-axis. FIG. 7 shows dexel structure 68, along the x-axis. FIG. 8 shows dexel structure 69, along the z-axis. On each figure, the lines of the dexels are parallel to the respective axis.

The outer normal vector to the boundary of the modeled volume at the end points of the segments may also be provided among the data. This allows a finer rendering of the modeled volume.

The method also comprises providing a sculpting operation (S20) on the modeled volume. A sculpting operation is any operation provided by the system for sculpting the modeled volume. By sculpting the modeled volume, it is meant adding and/or removing volume from the modeled volume via Boolean operations. Thus, a sculpting operation is any combination of at least one volume Boolean operation on the modeled volume. For example, local volume removal and local volume addition are sculpting operations, whereas extrusion from a surface is not a sculpting operation because it is not based on any Boolean operation. A sculpting process is any series of at least one sculpting operation. In an example, the sculpting operation is a series of successive Boolean operations involving a continuous volume (i.e. not disjoint) which is added (or substracted) to the modeled volume over a time duration. For example, the sculpting operation represents a machining operation.

Accordingly, the set of dexels may represent any solid and the method may simulate real sculpting of the solid. The method may notably be included in a real time machining simulation using a computer aided design system or a computer aided manufacturing system. In other words, the solid may be a stock and the method may display the shape of a stock being virtually machined by a cutting tool. In such a case, the modeled volume represents the stock, and the operation is a cutting operation. This example can be generalized to other manufacturing processes where material is also added to the part, such as composite manufacturing and shape sculpting on virtual clay. It can be generalized as well to all traditional solid modeling applications, including mechanical design, shape design, building architecture, etc. Finally, thanks to its performance capability, the method can handle more advanced applications such as interactive 3D sculpting. Most generally, the sculpting operation may represent a machining operation. In such a case, the modeled volume may represent a workpiece undergoing the machining operation, and the method thus improves the simulation of the machining of a workpiece. The method may thus serve as a good basis for testing virtually machining processes.

Indeed, the method further comprises updating (S30) (i.e. modifying) the set of dexels in response to (i.e. according to) the sculpting operation. In other words, the method applies the sculpting operation to the set of dexels which was initially provided (S10). The updated set of dexels represents the object after the sculpting (e.g. the machining).

Each dexel comprises a set of segments. All segments of a line intersecting the modeled volume are grouped into one dexel. This allows a line-by-line, and thus a more efficient processing of the modeled volume, for example because it allows parallel processing. Furthermore, the set of dexels is partitioned into groups of neighboring dexels. Dexels are said to be neighboring when a distance between them is inferior to a predetermined threshold. Accordingly, the set of dexels may be partitioned (i.e. divided into disjoint sub-sets of dexels, the reunion of which constitutes the whole set of dexels) into neighboring dexels (i.e. two dexels of a group are necessarily neighbors). The distance between a first dexel and a second dexel is the distance between the line of the first dexel and the line of the second dexel. The distance between a first line and a second line may be any distance measuring how far the first line stands from the second line. For example, if the lines are parallel, the distance may be the minimum Euclidian distance between a point of the first line and a point of the second line. If the lines are not parallel, the distance may be the minimum Euclidian distance between a point of the first line and a point of the second line, the two points belonging to the convex hull of the set of dexels.

A memory space depending on the maximum number of segments comprised in each of the dexels of the group is allocated to each group. In other words, the memory space allocated to a group is a function of the maximum number of segments comprised in each dexel of the group, this function being an increasing function, possibly a linear function. This allows an optimized use of the memory space allocated to the set of dexels. Indeed, sculpting operations, notably those which represent a machining operation, usually have a local impact on the modeled volume. Grouping the dexels into groups of neighbors allows a group-by-group processing of the set of dexels when updating (S30) it. Thereby, it is possible to allocate memory on a group-by-group basis and optimize the global allocated memory, as will be described with reference to examples.

The set of dexels may be partitioned into the groups of neighboring dexels in adaptation to a hardware implied in the execution of the method and/or a sculpting context. In other words, the partitioning may be adapted to (i.e. may depend on) the hardware used for execution of the method (such as a processor and/or a memory) and/or a sculpting context (i.e. information on the context of the method,). For example, the maximum number of neighboring dexels inside one group may be an increasing function of the number of parallel threads that the processor may perform. The sculpting context may comprise information on the modeled volume and/or the sculpting operation. For example, the sculpting context may measure a complexity of the modeled volume (e.g. a measure of how irregular it is) and/or a complexity of the sculpting operation (e.g. the geometry of a tool virtually used for performing the sculpting operation). The sculpting context may also comprise information on the size of such a tool. For example, the maximum number of neighboring dexels inside one group may be a decreasing function of the complexity of the modeled volume, the complexity of the sculpting operation, and/or an increasing function of the size of the sculpting tool.

The prior art is now discussed to highlight advantages of the method.

A decisive weakness of LDNI implementations known in the prior art is the size of memory required to reach a given accuracy level. Known LDNI implementations make use of "frame buffers" and "layers" and process the set of dexels representing the modeled volume with the GPU using OpenGL and Shaders programming. A "frame buffer" is a memory area located in the GPU that was initially dedicated to store an image as a bi-dimensional array of pixels. The GPGPU technology uses this frame buffer to store a bi-dimensional array of depth intervals (i.e. the segments of the dexels). It must be understood that each element of the frame buffer includes only one segment. A "layer" is defined as follows. Within each dexel, segments are sorted according to the depth order. A "layer" is the set of all segments having the same depth order.

The prior art computation, using OpenGL and Shaders programming, requires a complete frame buffer to store each layer. Therefore, given a dexel structure and noting $N_{max}$ the maximum number of intervals of a dexel, then $N_{max}$ layers are computed and stored in as many frame buffers. Even if most of the computed frame buffers are very sparse, the rigidity of memory management in this context requires, as far as one is willing, for performances purpose, to keep the whole model resident on the GPU board. Thus, if the set of dexels includes $N_x*N_y$ dexels, the on board memory has to reserve a buffer of size $N_x*N_y*N_{max}$. This is illustrated with reference to FIGS. 9-13.

For the dexel structure 67 of FIG. 6, the frame buffer size is $N_x*N_y=10*10$, according to the 10*10 grid of lines. Four layers (72, 74, 76 and 78) are defined by the dexels, as illustrated on FIG. 9, because at least one dexel (for example, circled dexel 65 of FIG. 6) includes four segments 60. It is now also referred to FIGS. 10-13 which represent frame buffers as a grid of size 10*10, within which boxes a cross is present when the frame buffer stores a dexel segment for the position on the grid corresponding to the box and the layer corresponding to the frame buffer. The first frame buffer 82 stores the first layer 72 of segments; the second frame buffer 84 stores the second layer 74 of segments; the third frame buffer 86 stores the third layer 76 of segments; and the fourth frame buffer 88 stores the fourth layer 78 of segments. The tables of FIGS. 10-13 illustrate the used and unused memory slots of frame buffers 82-88. An X-flagged box 87 stores one segment, an empty box 89 is unused memory. It must be understood that all four frame buffers (82, 84, 86, 88) are allocated memory, which illustrates a huge amount of unused memory.

The balance of allocated memory versus used memory for this example of the prior art is as follows. The memory size required for all four frame buffers is $N_x*N_y*N_{max}=10*10*4=400$, while the used memory is the number of dexels' intervals: 83. Furthermore, a sparse data representation of the LDNI frame buffers would not be directly derived from usual sparse matrix representations, such as linked lists of layers or indirection tables at dexel/thread level. Indeed, such techniques are not adapted to massively parallel hardware architecture and corresponding programming abstraction, so this would lead to inefficient execution speed and data flow.

As opposed to the prior art, the method allows a fast and robust updating (S30), while using relatively little memory space. Indeed, the structure of the data, which is organized as a set of dexels each comprising a set of at least one segment allows parallel processing. The partitioning into groups of neighboring dexels and the allocation of memory space depending on the maximum number of segments comprised in each of the dexels of the group allows the parallel processing to be performed on a group-by-group basis. As the sculpting operation usually has a local effect, this allows to reach the advantages of parallel processing while avoiding the inconvenient in terms of memory size occupied in the prior art.

Updating (S30) the set of dexels may comprise determining groups of neighboring dexels that are impacted by the sculpting operation and updating each of the determined groups. In other words, the updating (S30) modifies the groups that are actually to be modified upon update, so as to gain in efficiency. Indeed, it may be useful to predict which group of neighboring dexels are impacted by the sculpting operation, for example to speed up the computation.

Updating each of the determined groups may comprise, for a respective group, updating the dexels of the respective group by parallel processing. This allows a faster update (S30), and thus, if the set of dexels is displayed, a faster response to user-action providing the sculpting operation.

Parallel processing consists of performing multiple tasks by the system simultaneously. In the case of the method, updating the dexels of a respective group may comprise running a single instructions thread on each of the dexels of the respective group. Updating the dexels of the respective group may thus be performed by SIMD (Single Instruction Multiple Data) parallel processing. The processor of the system executing the method may notably be a massive parallel processing unit, for example if the system is networked with more than 10, or 100, processors.

For each dexel, usual modeling operators such as Boolean operations, offsets or collision detection boil down to their one-dimensional counter-part namely simple operations on segments. Since the computation and update of one dexel does not rely on corresponding operation on other dexels, the model is well adapted to massively parallel processing.

Working group and Single Instruction Multiple Data execution are now discussed and illustrated. The method may be executed via working groups and Single Instruction Multiple Data. The groups of neighboring dexels may constitute a working groups, and the step of updating (S30) may comprise a SIMD execution on each group determined to be impacted by the sculpting operation (such determining being possibly the first step of the SIMD execution).

Working groups and SIMD (Single Instruction Multiple Data) execution are OpenCL concepts. Namely, all threads belonging to the same working group behave according to the "single instruction multiple data" way. As an example, the very simple program that outputs the maximum number of two input numbers is now considered: i.e. max (a,b) where a and b are two input numbers.

The program may comprise the following instructions:

```
01  if (a > b) then
02      c := a
03  else
04      c := b
05  end if
06  return c
```

This program includes six instructions. Consider now the following "Test" program that computes the maximum number of three couples of numbers by calling "max" program three times.

```
Program Test
    x := max (5,4)
    y := max (2,6)
    z := max (3,3)
end.
```

A sequential run of "Test" program is for the computer to execute successively instructions 1,2,5,6 of first call, then instructions 1,3,4,5,6 of second call and instructions 1,3,4,5,6 of third call. This results in fourteen executed instructions.

Now, three treads belonging to the same working group may execute the "Test" program. Each thread runs one call to "max" program according to the SIMD strategy. This means that instructions of all three calls to program "max" are executed "at the same time" despite they handle different datasets. More precisely, Table I illustrates the step by step process.

TABLE I illustration of the process of running the "max(a, b) program" with three (a, b) pairs.

| Instruction | Dataset of first call a = 5, b = 4 | Dataset of second call a = 2, b = 6 | Dataset of third call a = 3, b = 3 | Computing step |
|---|---|---|---|---|
| 01 if (a > b) then | Execute | Execute | Execute | Step 1 |
| 02 c := a | Execute | Wait | Wait | Step 2 |
| 03 else | Wait | Execute | Execute | Step 3 |
| 04 c := b | Wait | Execute | Execute | Step 4 |

TABLE I-continued illustration of the process of running the "max(a, b) program" with three (a, b) pairs.

| Instruction | Dataset of first call a = 5, b = 4 | Dataset of second call a = 2, b = 6 | Dataset of third call a = 3, b = 3 | Computing step |
|---|---|---|---|---|
| 05 end if | Execute | Execute | Execute | Step 5 |
| 06 return c | Execute | Execute | Execute | Step 6 |

At step 1 of the computation, the working group executes the first instruction "if (a>b) then" of "max" program with all three data sets. At step 2, the branching effect is such that the first thread executes instruction 2 of "max" program, while second and third threads wait during this period of time. This is because second and third threads manage the a≤b situation, while first thread manages the a>b situation. At step 3, second and third threads execute instruction 3 of "max" program, while first thread waits. This continues as illustrated in the table. The bottom line is that the three threads working group runs three calls of "max" program by executing the equivalent computing time of 6 instructions, as opposed to the sequential strategy that runs fourteen instructions.

Clearly, this example illustrates that a working group of synchronous threads is efficient when the program is run with independent data sets and when the branching logics are not too divergent from one execution to the other.

Similarly, the method may update each of the groups by executing SIMD on the dexels of each group. As the dexels of each group are neighbors, the SIMD is likely to be executed in a timely similar manner on all the threads (i.e. the dexels of a group of neighboring dexels) of a working group (the said group of neighboring dexels). Indeed, the dexels of a same group are statistically similar and impacted by the sculpting operation in a similar way. Thus, the updating of the dexels of a same group usually comprises (almost) the same operations. For this reason, the advantages of parallel processing are reached, and memory space is saved.

The method may further comprise adapting the memory space allocated to an updated group when the maximum number of segments comprised in each of the dexels of the updated group is modified. In other words, the method may further comprise modifying the allocation of memory after updating (S30) the set of dexels in response to the sculpting operation. This may comprise de-allocating or further allocating memory blocks. This block allocation/de-allocation mechanism drastically improves the efficiency of the memory model. In practice, since the size of the on board memory is bounded, it enables a much better accuracy for a given memory size. It induces also a gain of performance.

The method may thereby provide a mechanism of memory block allocation/de-allocation adapted to the context of massively parallel hardware (as for example the CUDA or OpenCL programming abstraction). The blocks may be allocated/de-allocated at the working group level (an Open CL concept) and indirection tables may address these blocks for each working group and corresponding group of dexels.

The CUDA and OpenCL languages offer a programming abstraction for massively parallel hardware, with features discussed in the following with reference to an example.

In the example, threads are grouped in working groups (OpenCL terminology). Namely, the threads belonging to a same working group preferably execute in a SIMD manner (Single Instruction Multiple Data), and are therefore more efficient when the branching divergences are small.

The memory is split into two main categories. First, private/local (OpenCL terminology) memory of small size with quick access and private to a single thread or shared by a working group. Second, a large global memory area with slow access, visible from all threads and preferably accessed by contiguous blocks.

At some stage of the updating (S30), an individual thread is in charge of updating an individual dexel and a "working group" of synchronous threads manages a group of nearby dexels, that we call dexel group. The data structure of the example is designed so that all dexel groups have the same number of dexels, noted k. The geometric proximity of dexels of the same dexel group (typically a small sub-grid inside the grid) increases the likelihood of similar configuration and required number of layers.

Figure 14:
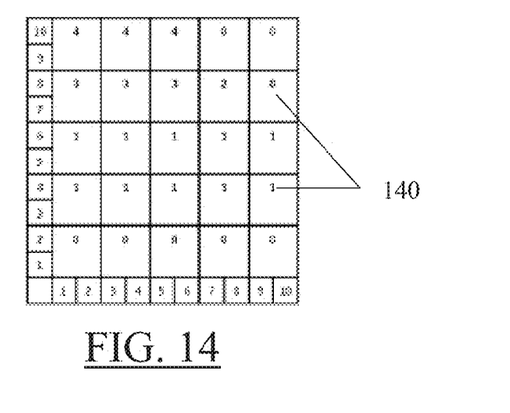

Referring back to the example of FIG. 6, the dexel structure 67 may be partitioned according to the method of the present example into a grid of 5*5=25 dexel goups, each group including k=4 dexels. All dexels within the same group may be allocated a same memory size, increasingly depending on the maximum number of segments of all dexels of said group. FIG. 14 illustrates the dexel groups together with their respective maximum numbers 140 of segments.

The memory size allocated for this dexel group structure stores ten groups of 1-segment dexels, three groups of 3-segments dexels, one group of 2-segments dexels and three groups of 4-segments dexels, that is (10*1+3*3+1*2+4*3)*4=132 memory units. Compared with the 400 memory units required by the prior art, this is a particularly high gain of memory space.

When, during the processing, the maximum number of segments of the dexels of a same dexel group increases of 1, a block of global memory may be allocated, of course, this memory block is sized to store segments. Conversely, when the maximum number of intervals of all dexels within the same working group decreases, the corresponding block in the memory block table may be de-allocated. This way, the next reallocation can reuse the free block. This can be therefore optimally performed by a group of SIMD (synchronous) threads.

At this point, little has been said on how to update each of the dexels of a group, apart from the fact that such update may occur via SIMD such that the step of updating (S30) is executed by parallel processing on each group. The method may comprise any scheme to update each of the dexels. For example, updating the dexels of a respective group comprises, for a respective dexel of the respective group, evaluating the impact of the sculpting operation on the respective dexel, and, accordingly, modifying the respective dexel. For example, if the sculpting operation is a cutting operation, the cutting volume may be subtracted from a dexel impacted by such operation.

Evaluating the impact of the sculpting operation on the respective dexel may comprise evaluating the impact of the sculpting operation on the segments of the respective dexel. In other words, the update occurs on a segment level. Indeed, the sculpting operation may modify the segment structure of a dexel. For example, some segments may be deleted, some segments may be added, and/or some segments may be modified.

The invention claimed is:

1. A computer-implemented method of optimizing memory allocation for designing a modeled volume, wherein the method comprises:

with respect to a subject modeled volume representing a physical product, providing at least one data structure having a grid of grids format and representing a set of dexels that represents the modeled volume, each dexel of the set of dexels comprising a set of at least one segment representing an intersection between a line of a set of lines and the modeled volume, each dexel being distinct from each line, wherein each line of the set of lines corresponds to at most one dexel of the set of dexels, wherein each segment of the set of segments comprises a pair of boundary points on the respective line, and wherein:

the set of lines comprises at least one subset of lines which are parallel and organized on a respective rectangular grid, a given subset of lines being partitioned into groups of neighboring lines, each group of neighboring lines being organized on a respective rectangular grid which is a two-dimensional subpart of the rectangular grid respective to the given subset of lines, resulting in a data structure representing a subset of dexels corresponding to the given subset of lines, the subset of dexels being partitioned into groups of neighboring dexels, each group of neighboring dexels being represented by a respective grid in the grid of grids format of the data structure representing the set of dexels, wherein a memory space depending on maximum number of segments comprised in each respective dexel of a respective group of neighboring dexels is allocated to the respective group, and wherein memory space is allocated to each respective group of neighboring dexels to provide an optimized allocation of memory space to the set of dexels, the memory space allocated to each respective group being by one or more processors as a function of the maximum number of segments comprised in each respective dexel of the group, the function being an increasing function;

providing a sculpting operation on the modeled volume by processing the set of dexels from the optimally allocated memory space;

updating the set of dexels in response to the sculpting operation, the updating designing the modeled volume representing the physical product, wherein the designed modeled volume is usable to manufacture the physical product, wherein updating the set of dexels comprises updating groups of neighboring dexels that are impacted by the sculpting operation; and adapting the memory space allocated to an updated group when the maximum number of segments comprised in each of the dexels of the updated group is modified;

the updating the set of dexels and the adapting the memory space being automatically implemented by the one or more processors.

2. The method of claim 1, wherein updating the set of dexels comprises determining the groups of neighboring dexels that are impacted by the sculpting operation and updating each of the determined groups.

3. The method of claim 2, wherein updating each of the determined groups comprises, for a respective group, updating the dexels of the respective group by parallel processing.

4. The method of claim 2, wherein updating dexels of a respective group of the determined groups, comprises, for a respective dexel of the respective group, evaluating impact of the sculpting operation on the respective dexel, and modifying the respective dexel based on the evaluated impact.

5. The method of claim 4, wherein evaluating the impact of the sculpting operation on the respective dexel comprises evaluating the impact of the sculpting operation on the segments of the respective dexel.

6. The method of claim 5, wherein updating the dexels of the respective group is performed by SIMD (Single Instruction Multiple Data) parallel processing.

7. The method of claim 1, wherein the set of dexels is partitioned into the groups of neighboring dexels in adaptation to a hardware implied in execution of the method and/or a sculpting context.

8. A system that optimizes memory allocation for designing a modeled volume, wherein the system comprises:

a memory having recorded thereon instructions for designing modeled volume;

a processor coupled to the memory and designing a subject modeled volume representing a physical product by the processor being configured to:

provide at least one data structure having a grid of grids format and representing a set of dexels that represents the modeled volume, each dexel of the set of dexels comprising a set of at least one segment representing an intersection between a line of a set of lines and the modeled volume, each dexel being distinct from each line, wherein each line of the set of lines corresponds to at most one dexel of the set of dexels, wherein each segment of the set of segments comprises a pair of boundary points on the respective line, and wherein:

the set of lines comprises at least one subset of lines which are parallel and organized on a respective rectangular grid, a given subset of lines being partitioned into groups of neighboring lines, each group of neighboring lines being organized on a respective rectangular grid which is a two-dimensional subpart of the rectangular grid respective to the given subset of lines, resulting in a data structure representing a subset of dexels corresponding to the given subset of lines, the subset of dexels being partitioned into groups of neighboring dexels, each group of neighboring dexels being represented by a respective grid in the grid of grids format of the data structure representing the set of dexels, wherein a memory space depending on maximum number of segments comprised in each respective dexel of a respective group of neighboring dexels is allocated to the respective group, and wherein memory space is allocated to each respective group of neighboring dexels to provide an optimized allocation of memory space to the set of dexels, the memory space allocated to each respective group is a function of the maximum number of segments comprised in each respective dexel of the group, the function being an increasing function;

provide a sculpting operation on the modeled volume by processing the set of dexels from the optimally allocated memory space;

update the set of dexels in response to the sculpting operation, the updating designing the modeled volume representing the physical product, wherein the designed modeled volume is usable to manufacture the physical product, wherein updating the set of dexels comprises updating groups of neighboring dexels that are impacted by the sculpting operation; and adapting the memory space allocated to an updated group when the maximum number of segments comprised in each of the dexels of the updated group is modified.

9. The system of claim 8, wherein the processor is a massive parallel processing unit.

10. The system of claim 8, wherein the system comprises a graphical user interface (GUI) communicatively configured to the processor and configured to request designing of the subject modeled volume.

11. The system of claim 10, wherein the processor is a Graphics Processing Unit (GPU).

12. A computer program product comprising:

a non-transitory computer readable storage medium, the computer readable storage medium having instructions configured to optimize memory allocation for designing a modeled volume representing a physical product by:

providing at least one data structure having a grid of grids format and representing a set of dexels that represents the modeled volume, each dexel of the set of dexels comprising a set of at least one segment representing the intersection between a line of a set of lines and the modeled volume, each dexel being distinct from each line, wherein each line of the set of lines corresponds to at most one dexel of the set of dexels, wherein each segment of the set of segments comprises a pair of boundary points on the respective line, and wherein:

the set of lines comprises at least one subset of lines which are parallel and organized on a respective rectangular grid, a given subset of lines being partitioned into groups of neighboring lines, each group of neighboring lines being organized on a respective rectangular grid which is a two-dimensional subpart of the rectangular grid respective to the given subset of lines, resulting in a data structure representing a subset of dexels corresponding to the given subset of lines, the subset of dexels being partitioned into groups of neighboring dexels, each group of neighboring dexels being represented by a respective grid in the grid of grids format of the data structure representing the set of dexels, wherein a memory space depending on maximum number of segments comprised in each respective dexel of a respective group of neighboring dexels is allocated to the respective group, and wherein memory space is allocated to each respective group of neighboring dexels to provide an optimized of memory space to the set of dexels, a processor allocating the memory space to each respective group as a function of the maximum number of segments comprised in each respective dexel of the group, the function being an increasing function;

providing a sculpting operation on the modeled volume by processing the set of dexels from the optimally allocated memory space;

updating the set of dexels in response to the sculpting operation, the updating designing the modeled volume representing the physical product, wherein the designed modeled volume is usable to manufacture the physical product, wherein updating the set of dexels comprises updating groups of neighboring dexels that are impacted by the sculpting operation; and automatically adapting the memory space allocated to an updated group when the maximum number of segments comprised in each of the dexels of the updated group is modified.

13. The method of claim 1, wherein one dexel of the set of dexels comprises a set of at least two segments.

14. The system of claim 8, wherein one dexel of the set of dexels comprises a set of at least two segments.

15. The computer program product of claim 12, wherein one dexel of the set of dexels comprises a set of at least two segments.

16. The method of claim 1, wherein allocating of the memory space further comprises:

allocating a first memory space value to a first group of neighboring dexels; and allocating a second memory space value higher than the first memory space value to a second group of neighboring dexels, wherein maximum number of segments comprised in each respective dexel of the second group being higher than maximum number of segments comprised in each respective dexel of the first group.

17. The system of claim 7, wherein the processor is further configured to allocate the memory space by:

allocating a first memory space value to a first group of neighboring dexels; and allocating a second memory space value higher than the first memory space value to a second group of neighboring dexels, wherein maximum number of segments comprised in each respective dexel of the second group being higher than maximum number of segments comprised in each respective dexel of the first group.

18. The computer program product of claim 12, wherein allocating of the memory space further comprises:

allocating a first memory space value to a first group of neighboring dexels; and allocating a second memory space value higher than the first memory space value to a second group of neighboring dexels, wherein maximum number of segments comprised in each respective dexel of the second group being higher than maximum number of segments comprised in each respective dexel of the first group.

* * * * *

UNITED STATES PATENT AND TRADEMARK OFFICE
CERTIFICATE OF CORRECTION

PATENT NO.        : 10,217,291 B2
APPLICATION NO.   : 13/666900
DATED             : February 26, 2019
INVENTOR(S)       : Nicolas Montana et al.

Page 1 of 1

It is certified that error appears in the above-identified patent and that said Letters Patent is hereby corrected as shown below:

In the Claims

In Column 17, Claim 12, Line 52, insert --allocation-- after "optimized".

Signed and Sealed this
Thirtieth Day of April, 2019

Andrei Iancu
*Director of the United States Patent and Trademark Office*